(12) United States Patent
Hattori et al.

(10) Patent No.: US 7,087,501 B2
(45) Date of Patent: Aug. 8, 2006

(54) MANUFACTURE OF PROBE UNIT HAVING LEAD PROBES EXTENDING BEYOND EDGE OF SUBSTRATE

(75) Inventors: Atsuo Hattori, Iwata (JP); Toshitaka Yoshino, Hamamatsu (JP); Tetsutsugu Hamano, Shizuoka-ken (JP); Masahiro Sugiura, Hamamatsu (JP)

(73) Assignee: Yamaichi Electronics, Co., Ltd., Tokyo (JP)

( * ) Notice: Subject to any disclaimer, the term of this patent is extended or adjusted under 35 U.S.C. 154(b) by 0 days.

(21) Appl. No.: 11/179,659

(22) Filed: Jul. 13, 2005

(65) Prior Publication Data
US 2005/0266690 A1 Dec. 1, 2005

Related U.S. Application Data

(62) Division of application No. 10/099,988, filed on Mar. 19, 2002, now Pat. No. 6,946,375.

(30) Foreign Application Priority Data
Mar. 23, 2001 (JP) .............................. 2001-086267

(51) Int. Cl.
*H01L 21/46* (2006.01)
*H01L 21/78* (2006.01)
*H01L 21/301* (2006.01)

(52) U.S. Cl. ..................... 438/461; 438/463; 438/611
(58) Field of Classification Search ................ 438/584, 438/597, 620, 461, 611, 703, 14, 463, 17
See application file for complete search history.

(56) References Cited

U.S. PATENT DOCUMENTS

| | | | |
|---|---|---|---|
| 3,825,807 A * | 7/1974 | Wolf | ........................... 257/450 |
| 6,225,219 B1 * | 5/2001 | Lee et al. | ................... 438/671 |
| 6,232,669 B1 * | 5/2001 | Khoury et al. | ............... 257/784 |
| 6,255,126 B1 | 7/2001 | Mathieu et al. | |
| 6,335,522 B1 | 1/2002 | Shimada et al. | |
| 6,362,087 B1 | 3/2002 | Wang et al. | |
| 6,408,122 B1 | 6/2002 | Shimada et al. | |
| 6,511,793 B1 * | 1/2003 | Cho et al. | ................... 430/323 |

(Continued)

FOREIGN PATENT DOCUMENTS

JP        7-199219        4/1995

(Continued)

OTHER PUBLICATIONS

Patent Abstracts of Japan, Suzuki et al. "Probe Unit and Manufacture Therof", Publication No. 08-015318, English Translation.*

*Primary Examiner*—W. David Coleman
*Assistant Examiner*—Khiem Nguyen
(74) *Attorney, Agent, or Firm*—Dickstein, Shapiro, Morin & Oshinsky, LLP.

(57) ABSTRACT

A sacrificial layer is formed in a recess of a substrate, and leads extending from the substrate into an area of the sacrificial layer are formed. A cut is formed from the bottom surface of the substrate, the cut extending from the bottom surface to the area of the sacrificial layer via the substrate, then the sacrificial layer is removed. A probe unit can be obtained having the leads whose front portions extend beyond the edge of the substrate. A through conductor may be formed in a through hole formed in a substrate. Leads may be formed on a photosensitive etching glass substrate to thereafter selectively etch the chemically cutting type glass.

2 Claims, 8 Drawing Sheets

U.S. PATENT DOCUMENTS 6,886,395 B1 * 5/2005 Minne .................. 73/105
2001/0039109 A1  11/2001 Mathieu et al.
2002/0086246 A1 * 7/2002 Lee ..................... 430/321

FOREIGN PATENT DOCUMENTS

JP          8-15318      1/1996

* cited by examiner

MANUFACTURE OF PROBE UNIT HAVING LEAD PROBES EXTENDING BEYOND EDGE OF SUBSTRATE

CROSS REFERENCE TO RELATED APPLICATION

This is a divisional application of U.S. patent application Ser. No. 10/099,988, filed Mar. 19, 2002, now U.S. Pat. No. 6,946,375, in the name of Atsuo HATTORI, Toshitaka YOSHINO, Tetsutsugu HAMANO, and Masahiro SUGIURA. This application is based on and claims priority of Japanese patent application No. 2001-086267, filed on Mar. 23, 2001, the whole contents of which are incorporated herein by reference.

BACKGROUND OF THE INVENTION

A) Field of the Invention

The present invention relates to a method of manufacturing a probe unit having leads disposed in parallel at a small pitch, each lead extending beyond the edge of a substrate to form an elastic beam. The probe unit is used, for example, for a conduction test of electrodes of a semiconductor integrated circuit, a liquid crystal panel or the like.

B) Description of the Related Art

A conduction test of a semiconductor integrated circuit, a liquid crystal panel or the like is performed in order to check whether the test sample operates normally satisfying the specification. This conduction test is performed, for example, by pressing the front end of a probe unit against electrodes disposed in parallel at the edge of a glass plate of a liquid crystal panel. It is therefore necessary that the front portions of leads of the probe unit formed on a substrate form elastic beams.

The pitch of the electrodes disposed at the edge of a liquid crystal panel is becoming smaller. The pitch of elastic beams of the front portions of leads of a probe unit is required correspondingly small.

The pitch of electrodes is presently 0.1 mm. A probe unit to be used with such electrodes is difficult to be formed with a punching machine. From this reason, etching or plating has been used for forming a probe unit.

Probe unit manufacture methods are disclosed, for example, in JP-A-8-015318. According to one method, two substrates are abutted together and a number of leads are grown by plating on the surface of the substrate to be disposed in parallel and traversing the two substrates. Next, one of the two substrates is removed from the leads extending on the surface of the substrate so that the front portions of leads extend beyond the edge of the other substrate to form elastic beams. According to the other method, a number of leads are grown by plating in parallel on the surface of one substrate. Next, the end portion of the substrate is cut so that the front portions of leads extend beyond the edge of the remaining substrate to form elastic beams.

Another probe unit manufacture method is disclosed in JP-A-7-199219. According to this method, a silicon oxide film is formed on a silicon substrate. The silicon oxide film is partially removed by etching to expose the surface of the silicon substrate on which elastic beams of probes are later formed. A metal film having a predetermined pattern is formed on the exposed silicon surface and oxide film. Leads of a probe unit are grown on the metal film by plating. Next, the exposed silicon substrate is removed by anisotropic etching so that the front portions of the leads extend beyond the edge of the remaining substrate to form elastic beams.

The first method disclosed in JP-A-8-015318 teaches some device of making a coupling force of a plated layer to a contact lead region of the substrate different from a coupling force to an elastic lead region of the substrate. However, there remains some problem that some tight contactness is required between a plated underlayer and the substrate in the elastic lead region when the plated underlayer is formed and when the plated layer is grown and that some peeling property is required when the substrate is removed from the leads. If the coupling force of the plated layer is too small, the plated layer is separated from the substrate because of stress generated during plating. The shape of a fine probe may be deformed or damaged. If the coupling force is high, the function of removing the substrate from leads becomes low and the leads may be deformed following the deformed shape of the substrate. If the single substrate is used and this substrate cannot be cut completely, elastic beams extending beyond the edge of the remaining substrate cannot be formed. It is necessary to cut the substrate without damaging the leads. This cutting is very difficult and there is a high possibility of damaging leads when the substrate is cut.

In a practical case, the substrate is cut to such a depth reaching near the leads so that the cutting blade does not contact the leads. After this cutting, the substrate is bent downward or upward about the cut to remove the end portion of the substrate. Since the cut had a finite depth, when the substrate was bent upward, the break positions became irregular because of the cut depth. Further, the substrate moves the lead front portions upward so that some elastic beams were deformed.

The irregularity of break positions was bigger when the substrate was bent downward than when it was bent upward. The lengths of elastic beams were irregular and the loads necessary for a predetermined bending amount were not able to be controlled. A bending work was not stable so that large forces were applied to some leads some of which were deformed.

The method described in JP-A-7-199219 requires to anisotropically etch the end portion of the substrate to form elastic beams. Therefore, the substrate is limited only to a silicon substrate. The insulating film such as a silicon oxide becomes essential. Various other substrates requested by users cannot be adopted.

SUMMARY OF THE INVENTION

It is an object of the present invention to provide a method of manufacturing a probe unit having elastic beams extending beyond the edge of a substrate by using any type of substrates without damaging leads, the method providing a proper fine pitch of leads and reliably supporting the leads on the substrate.

According to one aspect of the present invention, there is provided a method of manufacturing a probe unit having leads whose front portions extending beyond an edge of a substrate, the method comprising a step of forming a recess in a surface layer of a substrate; a step of forming a sacrificial layer filled in the recess; a step of forming a number of leads on the surface of the substrate, the leads being disposed in parallel and extending into an area of the sacrificial layer; a step of forming a cut extending from a bottom surface of the substrate into the sacrificial layer; and a step of removing the sacrificial layer.

According to another aspect of the invention, there is provided a method of manufacturing a probe unit having leads whose front portions extending beyond an edge of a substrate, the method comprising: a step of forming a through hole through a substrate; a step of forming a sacrificial layer filled in the through hole; a step of forming a number of leads on the surface of the substrate, the leads being disposed in parallel and extending into an area of the sacrificial layer; and a step of removing the sacrificial layer.

According to another aspect of the invention, there is provided a method of manufacturing a probe unit having leads whose front portions extending beyond an edge of a substrate, the method comprising the steps of: (a) applying a ultraviolet ray to a partial surface area of a photosensitive etching glass substrate; (b) forming a number of leads on the surface of the substrate, the leads being disposed in parallel and extending from a ultraviolet ray unradiated area into a ultraviolet ray radiated area; and (c) etching the glass substrate in the ultraviolet ray radiated area.

Leads can be formed by plating growth at a very fine pitch and with high precision. The thickness necessary for elasticity of elastic beams can be obtained sufficiently. Since the leads are properly supported by the substrate and/or the sacrificial layer in the recess, a proper pitch can be set. If the substrate is cut to form elastic beams by using a cut extending from the substrate bottom surface to the area of the sacrificial layer, physical force is not applied to the leads when the substrate is cut. A substrate part is separated by removing the sacrificial layer in the recess so that leads are not damaged when the substrate part is separated. Substrate part separation may be performed by removing the sacrificial layer in the through hole or etching a chemically cutting type glass substrate. Also in this case, leads are not damaged when the substrate part is separated.

A substrate to be used is not limited to a special substrate, but any substrate used by general probe units may be used.

DESCRIPTION OF THE PREFERRED EMBODIMENTS

Embodiments of the invention will be described with reference to the accompanying drawings.

FIGS. 1 to 4B are diagrams illustrating an embodiment of the invention, and FIGS. 5 to 8 are diagrams illustrating another embodiment of the invention.

A substrate 1 of a probe unit of each embodiment is not limited to a particular substrate, but a glass plate, a synthetic resin plate, a ceramic plate, a silicon plate, a metal plate or the like may be used. Of these plates, insulating substrates including a glass substrate and a ceramic substrate such as alumina are preferably used. If a conductive substrate such as a metal substrate is used, an insulating layer is formed on the substrate on the side where a recess to be described below is formed.

A recess 2 is formed on one surface side of the substrate. It is preferable to form the recess 2 straight and parallel to one side of the substrate. The recess 2 has a predetermined depth and width and traverses the substrate. The recess may be formed not traversing the substrate and having a length at least longer than the length of a final probe unit, and at a later process the substrate region without the recess is cut to form the recess traversing the substrate.

It is preferable to set the depth of the recess 2 to 0.05 to 3.0 mm and the width to 0.2 to 5 mm.

The recess is filled with a sacrificial layer. The material of the sacrificial film may be metal, resin such as epoxy and urethane, or inorganic material such as inorganic salt. Inorganic salt may be calcium carbonate.

The thickness of the sacrificial layer 4 is required to be deeper than the depth of the recess. The thickness is preferably about 0.05 to 0.4 mm, although it depends upon the thickness of the substrate and the depth of the recess.

In the following description, the sacrificial layer is made of a metal film by way of example.

Figure 1:
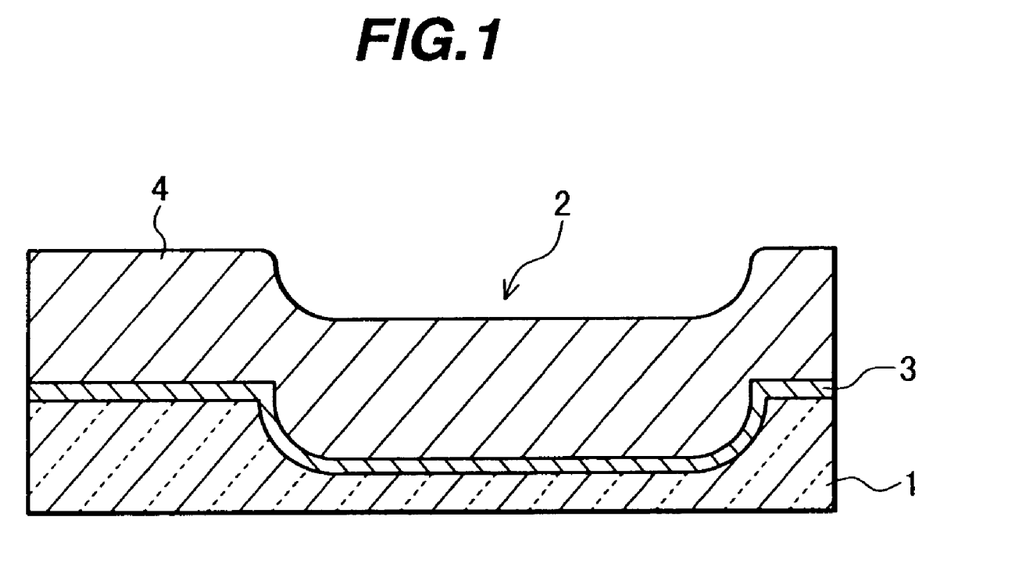
FIG. 1 is a cross sectional view of a substrate having a recess in a surface layer thereof, a plated underlayer formed on the whole surface including the recess, and a plated film formed on the whole surface.

As shown in FIG. 1, a plating underlayer 3 is formed by sputtering on the whole surface of the substrate with the recess 2. A sacrificial layer 4 is formed on the plating underlayer 3 by plating metal. Metal to be plated is metal, e.g., copper, different from the metal of a probe.

If copper is used as the metal to be plated, for example, chromium is sputtered as a tight contact layer and then copper is sputtered on chromium. In this specification, the tight contact layer and upper sputter layer are collectively called a plating underlayer. The plating underlayer used for forming a metal sacrificial layer in the recess is called a recess plating underlayer 3. Without forming the plating underlayer, the sacrificial layer of metal may be formed by electroless plating.

Figure 2A:
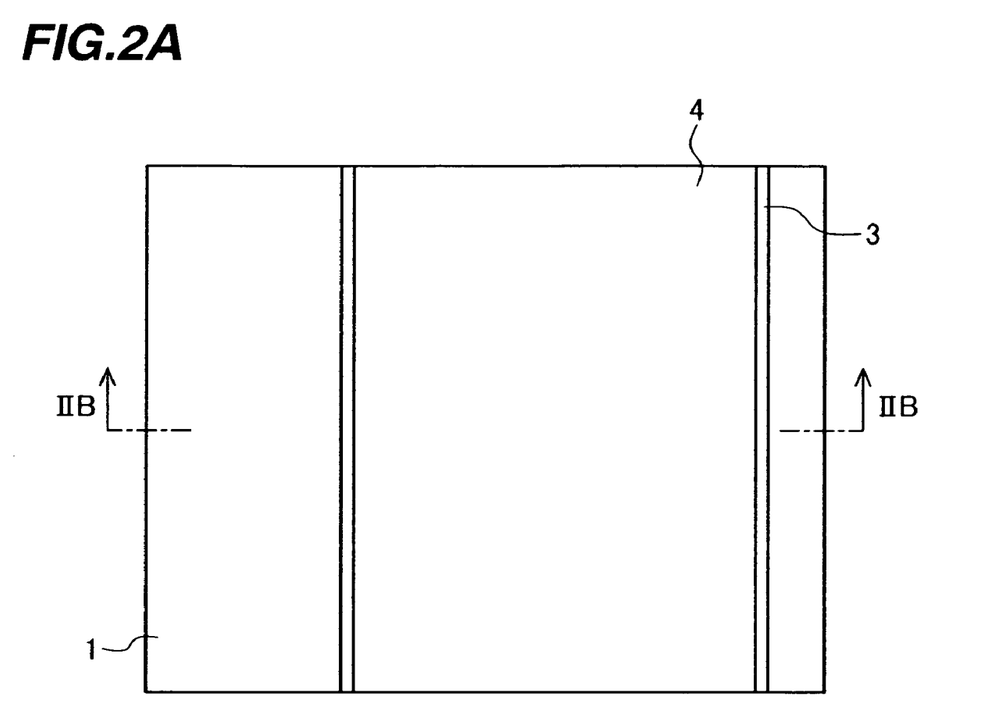
FIGS. 2A and 2B are a plan view of the substrate having metal left only in the recess and a flat whole surface including the metal surface, and a cross sectional view taken along line IIB—IIB.
Figure 2B:
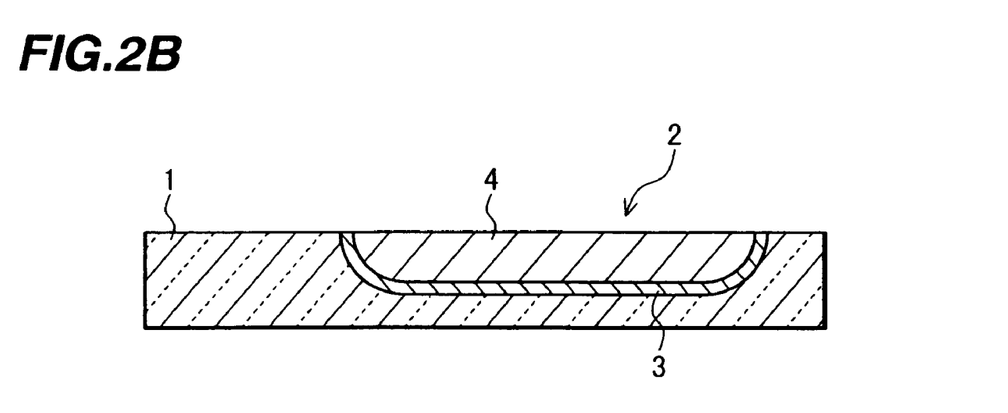

If the sacrificial layer is made of metal, the cross sectional shape of the recess at its opposing end portions is preferable a smooth arc shape. The radius of the arc shape is preferably larger than the depth of the recess. If the cross sectional shape of the recess is a rectangle having a bottom surface and vertical side walls, voids may be formed in the sacrificial layer during plating growth of metal from the recess plating underlayer on the bottom surface and side walls. If the shape of the recess has the arc shape, voids are difficult to be formed in the metal layer in the recess. Next, the plated surface is polished to leave the metal layer 4 only in the recess 2 and expose the substrate 1 in the other area, as shown in FIGS. 2A and 2B. The whole polished surface is preferably flat including the surface of the metal layer 4.

If the substrate is made of conductive material, after an insulating layer is formed on the substrate surface side on which a recess is formed, the recess is formed and the recess plating underlayer is formed on the whole substrate surface. Next, a metal layer is formed, and the surface thereof is polished to leave the metal layer only in the recess and expose the insulating layer on the whole surface excepting the surface of the metal layer in the recess.

If the sacrificial layer is made of epoxy resin or urethane resin, the substrate made of glass, ceramic, metal or the like is used so that the sacrificial layer can be selectively removed at a later process. In this case, the cross sectional shape of the recess is not limited to the arc shape, but the shape may be a rectangle constituted of the bottom surface and side walls.

Resin is filled in the recess to the position higher than the recess and hardened. Thereafter, polishing is performed to planarize the whole substrate surface, to leave the resin only in the recess, and to expose the substrate in the other area.

For example, if epoxy resin is used, this resin can be hardened by a heat treatment at 150° C. The time required to form the sacrificial layer of resin can be shortened considerably as compared to the sacrificial film formed by plating.

If the sacrificial film is made of inorganic salt such as calcium carbonate, powders are filled in the recess while taking care in not forming voids or dents, and pressed. Thereafter, the surface is polished to leave the inorganic sacrificial layer only in the recess.

Next, a plating underlayer (hereinafter called a probe plating underlayer) 5 is formed on the whole polished surface. Then, a resist pattern is formed having openings corresponding to the leads of probes. The plating underlayer is exposed only in the openings. The resist pattern has preferably such a shape so that leads are disposed in parallel at the same pitch along a direction perpendicular to the longitudinal direction of the recess.

The front portion of each lead of the probe is positioned on the sacrificial layer 4, and the remaining portion of the lead is positioned only on one side of the substrate remote from the front portion.

The exposed surface of the probe plating underlayer 5 with the resist pattern is subjected to plating to grow and form leads 6 by using known Fe, Ni plating liquid such as sulfuric acid based liquid.

In forming leads, known pattern forming methods can be used. For example, the probe plating underlayer 5 having the probe pattern may be formed, a metal film of the probe underlayer may be formed on the whole substrate surface and patterned by photolithography, or conductive paste may be printed on the substrate surface.

Next, after the resist pattern is removed, the probe plating underlayer excepting those formed with the leads 6 is removed by milling. With the above processes, the probe unit can be formed having the leads 6 disposed in parallel on the substrate 1 with the sacrificial layer filled in the recess 2.

The thickness of each lead is preferably about 10 μm to 80 μm.

Figure 3A:
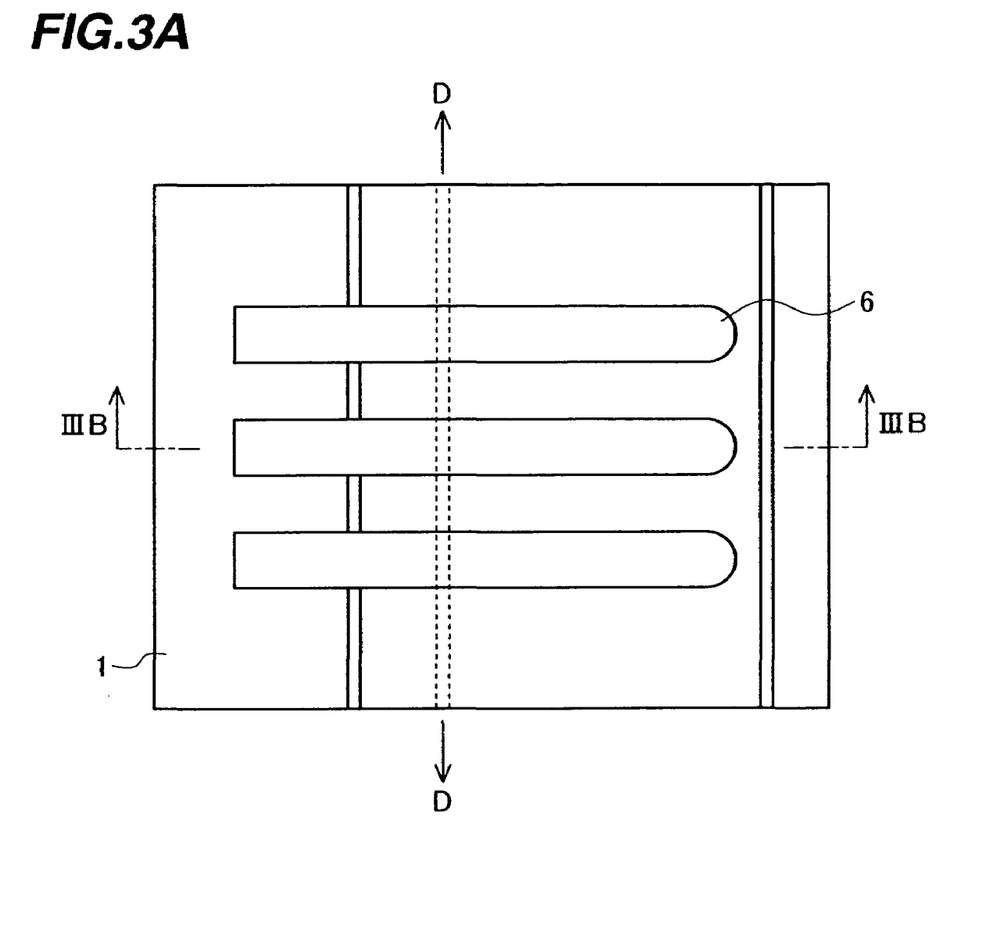
FIGS. 3A and 3B are a plan view of the substrate with the metal only in the recess, the substrate having a predetermined probe metal pattern formed by plating, and a cross sectional view taken along line IIIB—IIIB.
Figure 3B:
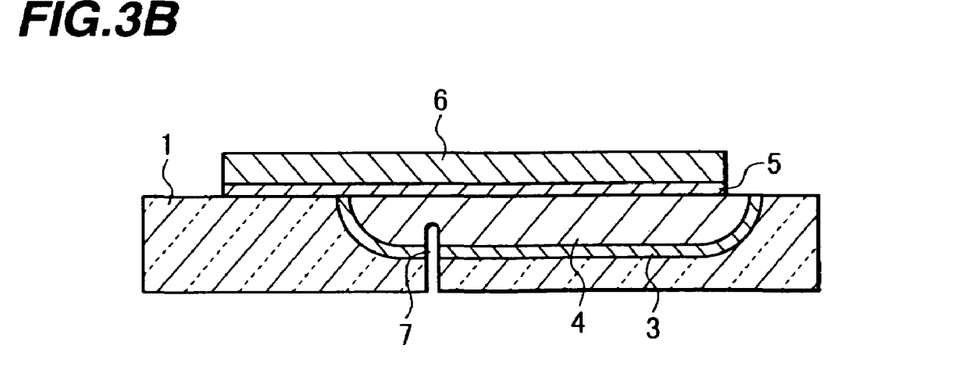

FIG. 3A is a plan view of the probe unit formed in the above manner. FIG. 3B is a cross sectional view taken along line IIIB—IIIB.

Plating metal is preferably nickel, nickel alloy such as NiW and NiFe or metal glass so that each lead of the probe can have proper rigidity and elasticity.

As shown in FIG. 3B, a cut 7 is formed through the substrate 1 to a predetermined depth of the sacrificial layer 4 as shown by a line D—D. The cut 7 is formed from the bottom surface of the substrate 1 at the position in the range of the whole width of the lead 6 and in the range of the sacrificial layer. The cut 7 reaches the predetermined depth of the sacrificial layer 4 and does not cut the whole depth of the sacrificial layer 4 in the recess. Although this cut 7 partitions the substrate, the substrate cannot be separated into two parts because the substrate is attached to the sacrificial layer 4 in the recess and the leads 6.

Figure 4A:
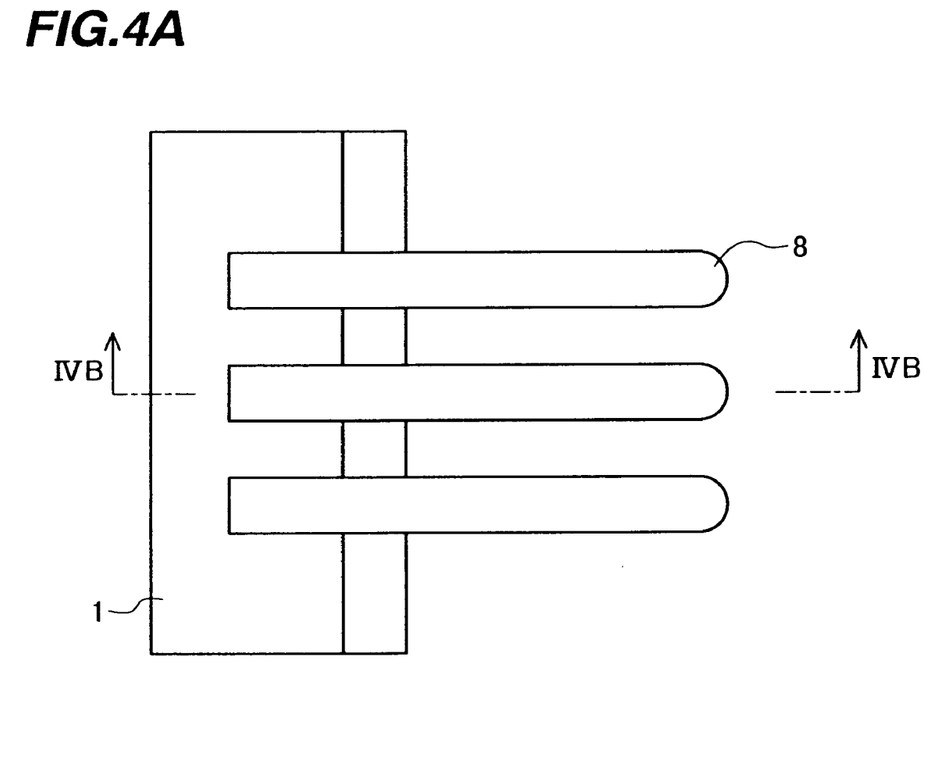
FIGS. 4A and 4B are a plan view of probes and a cross sectional view taken along line IVB—IVB.
Figure 4B:
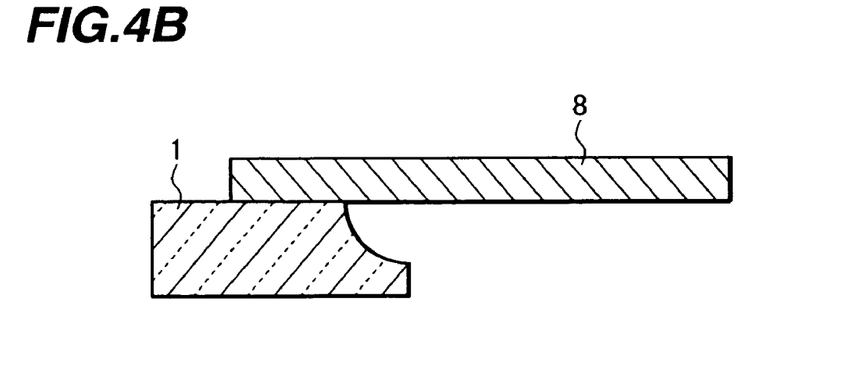

As the sacrificial layer in the recess is removed, the substrate is separated into two parts. Therefore, as shown in FIGS. 4A and 4B, the front portion of each lead 6 extends beyond the edge of the substrate to form an elastic beam 8, and the other portion thereof is firmly coupled to the substrate. A probe unit can therefore be obtained whose leads are disposed in parallel at a predetermined pitch.

The direction and shape of the cut along the substrate thickness direction may be set as desired.

If the sacrificial layer is made of metal, it can be removed by etching. If the sacrificial layer is made of resin, it can be removed by solvent such as hot N-methylpyrrolidone, by ashing or by dry etching. If the sacrificial layer is made of inorganic salt such as calcium carbonate, it can be removed by nitric acid or the like.

With the above-described manufacture method, the cut does not extend to the position abutting the lead 6 of the probe and a physical force is not applied such as a peeling force between the leads 6 and substrate 1. Accordingly, a probe having leads reliably disposed at a small pitch can be obtained by patterning and plating growth without damaging leads.

EXAMPLE 1

In one surface layer of a glass substrate of 76.2 mm square and 0.66 mm in thickness, a recess having a width of 5 mm, a length of 76.2 mm and a depth of 0.3 mm was formed in parallel to one side of the substrate. The cross sectional shape of the recess at opposing end portions had a smooth arc shape having a radius of 0.5 mm. Chromium as a tight contact layer was sputtered on the surface of the substrate on the recess side, and copper as a plating underlayer was sputtered on the tight contact layer. Copper was plated to a thickness of about 0.35 mm.

The substrate was roughly polished by using abrasive grains having a diameter of 3 μm and 1 μm, and then finely polished by using abrasive grains having a diameter of 0.5 μm. The substrate was planarized by removing the metal layer on the substrate excepting the metal layer in the recess. Voids did not exist in the plated copper in the recess.

On the whole surface of the planarized substrate, a probe plating underlayer of Ti/NiFe was formed by sputtering. On this probe plating underlayer, a resist pattern was formed having openings in the areas corresponding to probes. Each opening extended from an upper area of one side of the substrate outside of the recess to an upper area of the copper plated layer. Each opening was disposed perpendicular to the longitudinal direction of the recess. A number of openings were disposed at a fine pitch.

An NiFe layer was plated to a thickness of about 30 μm on the probe plating underlayer in each opening.

This substrate was immersed into an ultrasonic vessel to remove the resist pattern by N-methylpyrrolidone. The whole substrate was subjected to milling by using argon gas to remove the probe plating underlayer and leave probes.

A cut was formed from the bottom surface of the substrate (surface not formed with the probes) to a predetermined depth of the metal layer in the recess at a position near one end portion of the recess on the side where the leads extend on the substrate. The cut extended in parallel to the recess longitudinal direction. The cut did not reach the upper surface of the metal layer.

The metal layer was removed by copper etchant, and the substrate not coupled to the probes was dismounted. Chromium of the tight contact layer was removed by chromium etchant. A probe unit was obtained having the front portions of the leads extending beyond the edge of the substrate to form elastic beams and the other portions firmly coupled to the substrate.

Another embodiment of the invention will be described.

A through hole is formed through the substrate in an area where the front portions of all leads are to be disposed in parallel. The through hole is not formed in the opposite side areas where no lead exists. The through hole has such a shape that the substrate is not separated into two parts.

The through hole may be formed: by forming through holes in ceramic sheets still not baked by using a punching machine, laminating as many ceramic sheets as necessary, and then baking the ceramic sheets; by forming a through hole in a baked ceramic sheet by using laser, sand blast or the like; by forming a through hole by etching using a resist pattern; or by forming a through hole in a metal substrate by cutting and forming an insulating film on the substrate surface and the inner wall of the through hole.

Figure 6:
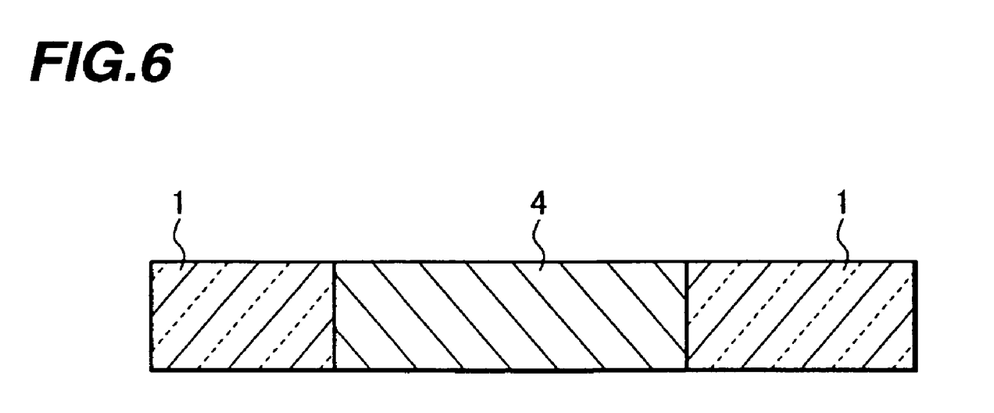
FIG. 6 is a cross sectional view of a substrate having a through hole in which a sacrificial layer is formed and a flat whole surface including the sacrificial layer surface.

As shown in FIG. 6, a sacrificial film 4 is formed in the through hole. The sacrificial film may be formed by filling metal paste such as copper paste in the through hole, or by filling resin or inorganic material in the through hole similar to the embodiment described earlier.

The sacrificial film made of metal paste will be described by way of example.

Figure 5:
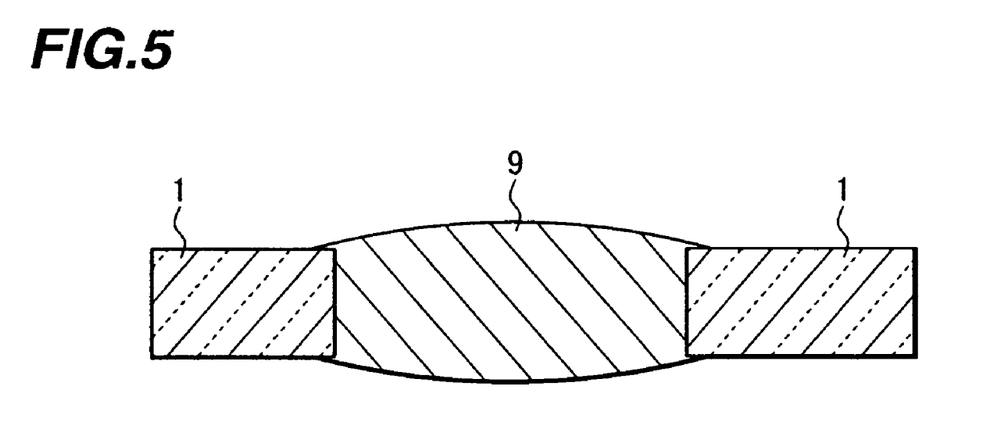
FIG. 5 is a cross sectional view showing a substrate having a through hole in which metal paste is filled.

As shown in FIG. 5, metal paste 9 is filled in the through hole. The metal paste 9 contains solvent. As the metal paste 9 filled in the through hole is heated, the solvent is evaporated so that the sacrificial layer made of metal can be formed. Since the metal paste contracts when it changes to metal, excessive metal paste is filled in the through hole to such an extent that the metal paste is swelled as shown in FIG. 5. As shown in FIG. 6, the substrate having the through hole filled with metal paste is heated to form a sacrificial layer 4 made of metal. Overflowed metal is removed by polishing so that the metal is filled in the whole area of the through hole and no metal exists in the area outside the through hole.

The metal paste may be filled in the through hole from the upper surface side of the substrate, by covering the bottom surface of the substrate with a tape or the like. If metal paste having a sufficiently high viscosity, the metal paste may be filled in the through hole without using the tape.

The amount of metal paste may be set so that the through hole is not completely filled with metal when the metal paste is changed to metal. In this case, dents in the through hole are filled with plated metal which is formed to such an extent that the plated metal is swelled over the through hole. The top and bottom surfaces of the substrate are polished so that the metal is filled in the whole area of the through hole and no metal exists in the area outside the through hole.

If the sacrificial layer is made of resin, excessive resin is filled in the through hole to such an extent that the resin is swelled over the through hole, because when the resin is hardened, it contracts. After the resin is hardened by a heat treatment or the like, the top and bottom surfaces are polished.

Inorganic material such as calcium carbonate does not contract. After inorganic material is filled in the through hole, the inorganic material is pressed without forming dents in the through hole.

Leads of probes are formed on the surface of the substrate with the sacrificial layer filled in the through hole. The lead forming method of the above-described embodiment can be applied.

Figure 7A:
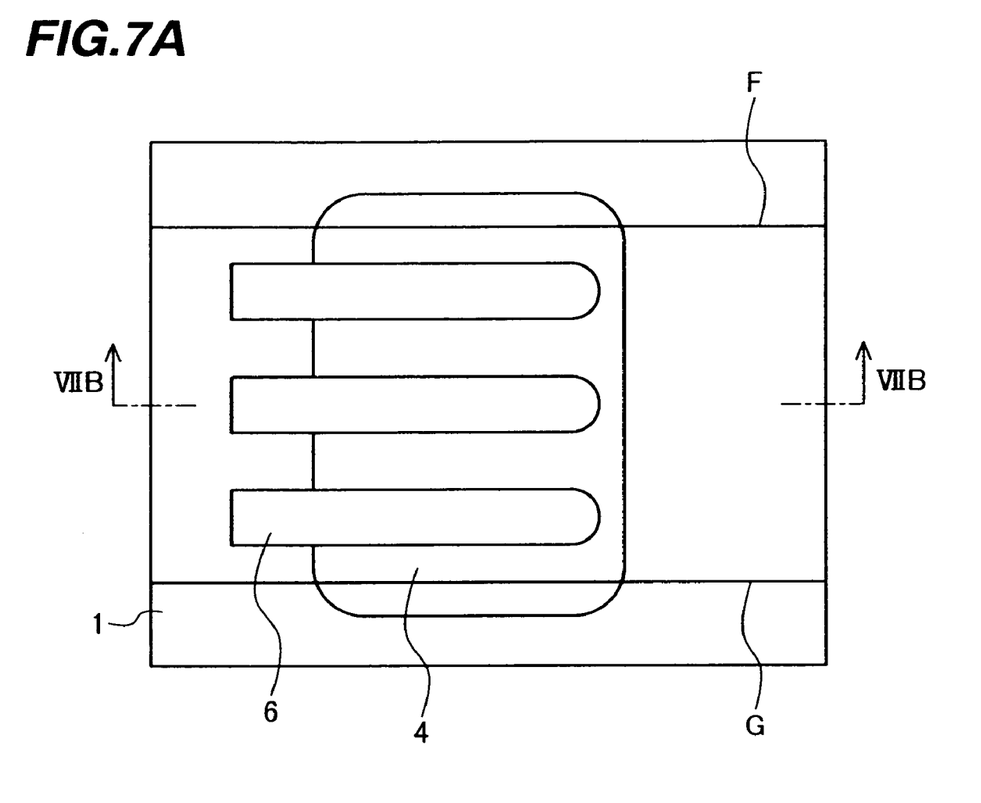
FIGS. 7A and 7B are a plan view of leads formed on the substrate having the sacrificial film in the through hole, and a cross sectional view taken along line VIIB—VIIB.
Figure 7B:
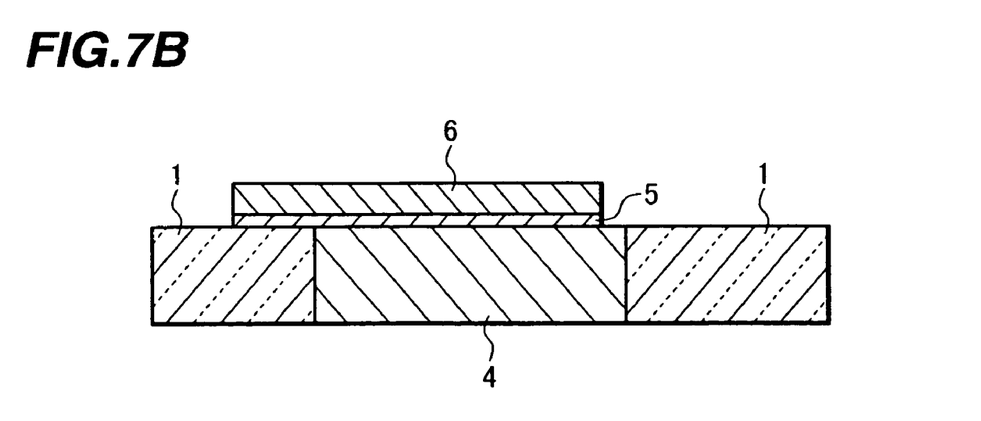

FIG. 7A is a plan view of the substrate formed with leads and FIG. 7B is a cross sectional view along line VIIB—VIIB shown in FIG. 7A.

The sacrificial layer 4 in the through hole of the substrate formed with the leads is removed. After or before the sacrificial film is removed, the opposite side areas of the substrate are cut in parallel to the leads, for example, along lines F and G shown in FIG. 7A traversing the through hole.

If the sacrificial film 4 is removed after the substrate is cut, the substrate is separated into two parts. The front portion of each lead 6 extends beyond the edge of the substrate 1 to form an elastic beam 8 and the other portion is firmly coupled to the substrate. A probe unit having leads disposed in parallel at a predetermined pitch can therefore be obtained.

If the sacrificial film is removed before the substrate is cut, elastic beams extend over the through hole. The substrate is then cut to obtain a probe unit.

Figure 8:
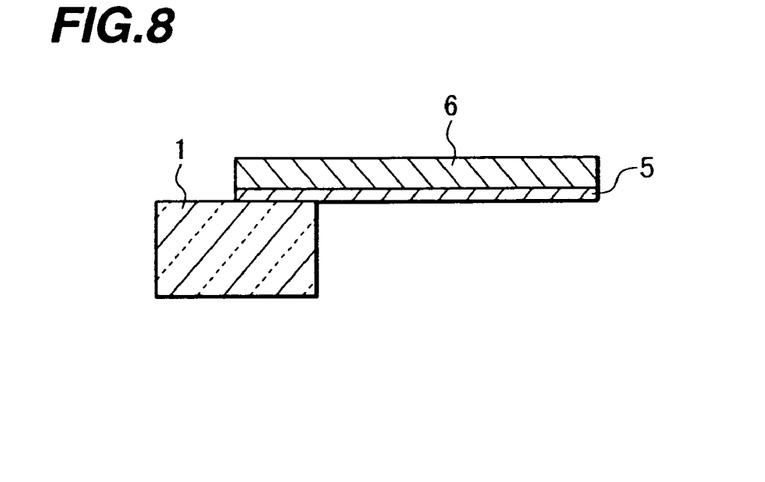
FIG. 8 is a cross sectional view of a probe obtained by a method including a through hole forming process.

FIG. 8 is a cross sectional view of the obtained probe unit.

EXAMPLE 2

Through holes of 5 mm×10 mm were formed through ceramic substrates not baked each having a thickness of 100 μm by using a punching machine. Twelve ceramic substrates were laminated. The through hole of the ceramic lamination substrate was filled with conductive copper paste (product name: CF-2800 manufactured by Harima Chemicals Inc.). This copper paste contains 20 vol % solvent. Since the copper paste contracts when it is heated, excessive copper paste was filled in the through hole to such an extent that the copper paste is swelled over the through hole. The substrate was placed in an oven and heated to evaporate the solvent. The copper was completely filled in the through hole. The top and bottom surfaces of the substrate were polished. The metal layer was completely filled in the through hole, and overflowed metal in the area outside the through hole was removed to expose the ceramic substrate.

Leads extending above the through hole were formed on the substrate in the manner similar to Example 1.

The opposite side areas of the substrate were cut in parallel to the leads along lines F and G traversing the through hole outside the leads. A unit having two substrate parts coupled by the metal layer in the through hole was obtained.

This copper layer was etched in the manner similar to Example 1 to obtain a probe unit having elastic beams extending beyond the edge of the substrate.

A still further embodiment will be described.

In this embodiment, a substrate made of photosensitive etching glass is used.

If ultraviolet rays are applied to photosensitive etching glass and a heat treatment is performed, fine crystals are precipitated. A solubility speed of the region with precipitated crystals, relative to dilute hydrofluoric acid, becomes very large as compared to that of the region with no precipitated crystals, allowing to selectively and chemically cut the glass.

Figure 9:
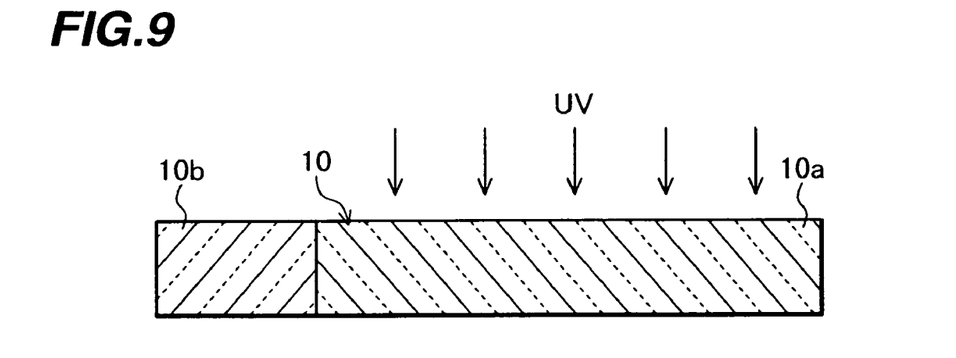
FIG. 9 is a cross sectional view illustrating exposure of ultraviolet rays toward a photosensitive etching glass substrate.

As shown in FIG. 9, ultraviolet rays are applied to a photosensitive etching glass substrate 10 in an area other than the area where leads coupled later to the substrate are left.

The substrate 10 has an ultraviolet ray radiated area 10a and an ultraviolet ray unradiated area 10b.

Figure 10:
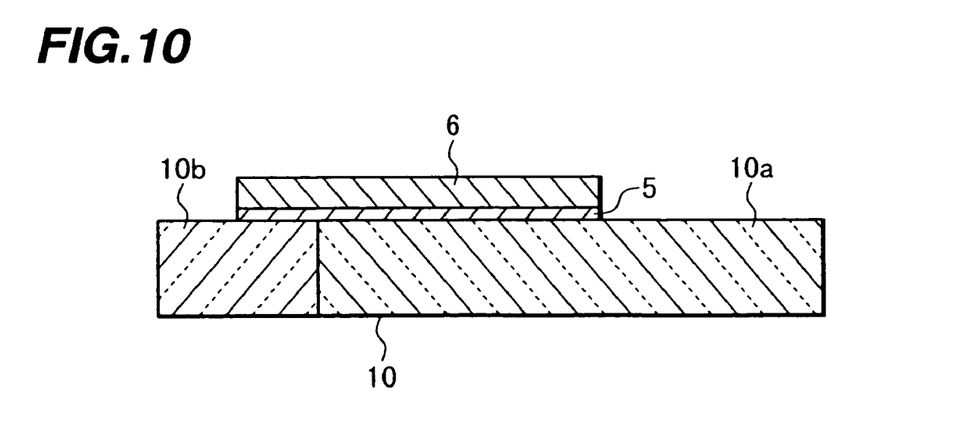
FIG. 10 is across sectional view of a lead formed on the substrate which was partially exposed with ultraviolet rays, the lead extending from the ultraviolet ray unradiated area to the ultraviolet ray radiated area.

As shown in FIG. 10, a number of leads are disposed in parallel on the substrate 10, the leads extending from the ultraviolet unradiated area 10b to the ultraviolet radiated area 10a. The longitudinal direction of each lead is set, for example, perpendicular to the boundary line between the ultraviolet ray radiated and unradiated areas.

Metal having a good tight contactness to the glass substrate such as Ti is used as the material of the probe plating underlayer for leads. The other points are similar to the first embodiment.

Figure 11:
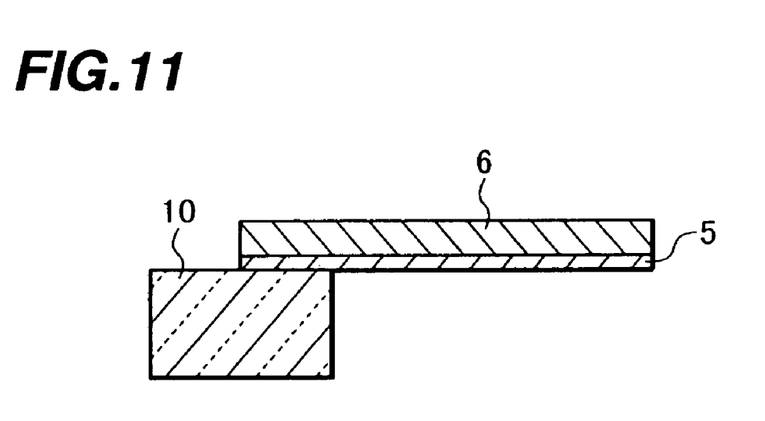
FIG. 11 is a cross sectional view of a probe unit having elastic beams extending beyond the edge of a crystallized glass substrate.

As shown in FIG. 11, the glass in the ultraviolet ray radiated area is etched and removed by dilute hydrofluoric acid. A probe unit having leads extending beyond the edge of the glass substrate in the ultraviolet ray unradiated area can therefore be obtained. This substrate is baked for 2 to 3 hours at 800 to 900° C. to change the substrate to crystallized glass so that the mechanical strength and thermal conductivity can be improved. A probe unit having leads extending beyond the edge of the crystallized glass substrate can be obtained.

EXAMPLE 3

Photosensitive etching glass was used as a substrate. By shielding one end area of the substrate, ultraviolet rays were applied to the other area by using an exposure machine with a ultra high pressure mercury lamp as a light source. Here the ultraviolet rays may include G line (436 nm), I line (365 nm), and/or H line (405 nm). Ti and then Ni were sputtered to the whole surface of the substrate to form a probe plating underlayer.

Resist was coated on the substrate, prebaked, exposed, hardened, developed and washed to form a resist mask having openings in areas corresponding to leads. On the plating underlayer exposed in the openings, an NiW layer was plated to a thickness of 30 μm. Next the resist was removed by ashing and the exposed probe plating underlayer was removed by milling.

The ultraviolet ray radiated area of the substrate was etched by 5–6% hydrofluoric acid, and washed by pure water. The substrate was baked to form crystallized glass. A probe unit having leads extending beyond the edge of the crystallized glass substrate was obtained.

Figure 12:
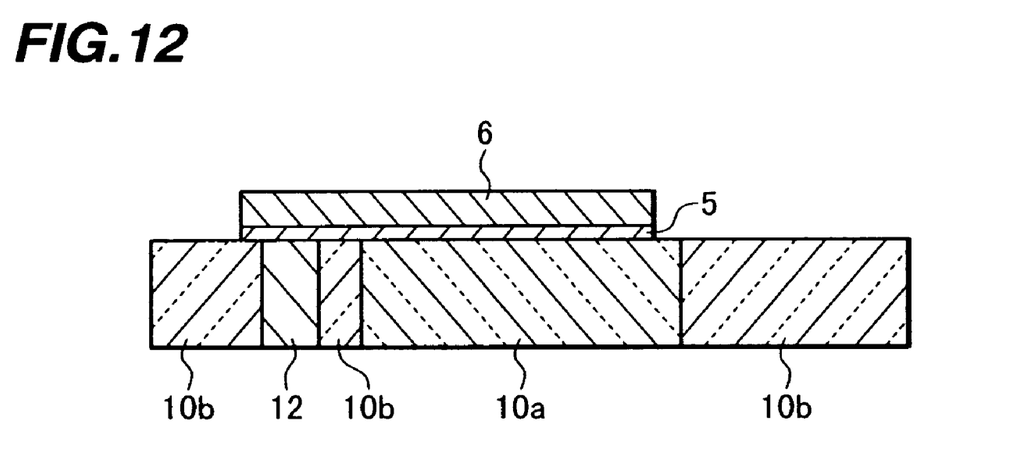
FIG. 12 is a cross sectional view of a substrate having conduction holes reaching the bottom surface of the substrate, leads being formed on the substrate.

FIG. 12 shows another modification. Through conductors are formed in a photosensitive etching glass substrate 10 so that electrodes can be led from the leads to the bottom surface of the substrate. Ultraviolet rays are applied to areas 12 led to the bottom surface, and the substrate is baked for about 30 minutes at 550 to 600° C. to precipitate crystals in the radiated area.

This crystal precipitated area is chemically cut (etched) by dilute hydrofluoric acid to form holes through the substrate. Silver or copper paste is filled in each hole in a manner similar to the process described with FIG. 5. The substrate is then baked to fill the whole through holes with metal.

Similar to the embodiment shown in FIGS. 10 and 11, leads are formed. Namely, ultraviolet rays are applied to the area of the substrate where the front portion of each lead is exposed, to form a ultraviolet ray radiated area 10a. Leads are formed each being connected to the metal layer 12 filled in the through hole and each extending from the ultraviolet ray unradiated area 10b to the ultraviolet ray radiated area 10a. Thereafter, the ultraviolet ray radiated area 10b is chemically cut. In this manner, a probe unit can be obtained in which leads are guided to the bottom surface of the substrate to be connected to a wiring unit.

The present invention has been described in connection with the preferred embodiments. The invention is not limited only to the above embodiments. It is apparent that various modifications, improvements, combinations, and the like can be made by those skilled in the art.

We claim:

1. A method of manufacturing a probe unit having leads whose front portions extending beyond an edge of a substrate, the method comprising the steps of:
   (a) applying a ultraviolet ray to a partial surface area of a photosensitive etching glass substrate, to precipitate fine crystals in ultraviolet ray radiated area;
   (b) forming a number of leads on the surface of the substrate, the leads being disposed in parallel and extending from a ultraviolet ray unradiated area into a ultraviolet ray radiated area; and
   (c) etching the glass substrate in the ultraviolet ray radiated area.

2. A method according to claim 1, further comprising, before said step (b), the steps of:
   (x) applying a ultraviolet ray to areas over which the leads are to be formed in an area where the ultraviolet ray is not radiated, and etching the irradiated areas to form through holes; and
   (y) filling the through holes with conductive members.

* * * * *